US012775958B2

(12) United States Patent
Shin et al.

(10) Patent No.: US 12,775,958 B2
(45) Date of Patent: Oct. 27, 2026

(54) APPARATUS AND METHOD FOR SUPPORTING PRODUCT PLANNING

(71) Applicant: DESIGNOVEL, Pohang-si (KR)

(72) Inventors: Ki Young Shin, Seoul (KR); Woo Sang Song, Seoul (KR)

(73) Assignee: DESIGNOVEL, Pohang-si (KR)

( * ) Notice: Subject to any disclaimer, the term of this patent is extended or adjusted under 35 U.S.C. 154(b) by 0 days.

(21) Appl. No.: 19/028,953

(22) Filed: Jan. 17, 2025

(65) Prior Publication Data

US 2025/0245587 A1 Jul. 31, 2025

(30) Foreign Application Priority Data

Jan. 26, 2024 (KR) ........................ 10-2024-0012648

(51) Int. Cl.
*G06Q 30/0202* (2023.01)
*G06F 30/27* (2020.01)
(Continued)

(52) U.S. Cl.
CPC ....... *G06Q 10/06313* (2013.01); *G06F 30/27* (2020.01); *G06Q 10/40* (2026.01); *G06Q 30/0202* (2013.01)

(58) Field of Classification Search
CPC ......... G06Q 30/06321; G06Q 30/0601; G06Q 30/0643; G06F 30/27
See application file for complete search history.

(56) References Cited

U.S. PATENT DOCUMENTS

2013/0138503 A1 * 5/2013 Brown ............... G06Q 30/0203 705/14.45
2018/0308030 A1 10/2018 Nemati et al.
(Continued)

FOREIGN PATENT DOCUMENTS

JP 8-30674 A 2/1996
JP 2006-527886 A 12/2006
(Continued)

OTHER PUBLICATIONS

Jianri Li and Jae-whan Lee and Woo-sang Song and Ki-young Shin and Byung-hyun Go. Designovel's system description for Fashion-IQ challenge 2019. https://arxiv.org/abs/1910.11119 (Year: 2019).*
(Continued)

*Primary Examiner* — Johnna R Loftis
(74) *Attorney, Agent, or Firm* — ZION IP; Byungwoong Park

(57) ABSTRACT

An apparatus and method for supporting product planning capable of predicting product design planning and sales quantity based on data are disclosed. An apparatus for supporting product planning according to one embodiment includes an interface configured to input or output data, and a product planner connected to the interface, in which the product planner classifies one or more search images searched based on at least one of collected one or more keywords into one or more clusters, receives a reference image selection input from a user through the interface for selecting at least one of the one or more search images classified into the one or more clusters, receives image editing prompt data from the user through the interface, and outputs a product design image based on one or more images selected as the reference image selection input and the image editing prompt data.

10 Claims, 9 Drawing Sheets

(51) Int. Cl.

| | |
|---|---|
| ***G06Q 10/0631*** | (2023.01) |
| ***G06Q 10/40*** | (2026.01) |

(56) References Cited

U.S. PATENT DOCUMENTS

| | | | | |
|---|---|---|---|---|
| 2019/0087529 | A1* | 3/2019 | Steingrimsson | G06N 20/10 |
| 2020/0005087 | A1* | 1/2020 | Sewak | G06F 3/0481 |
| 2021/0383584 | A1 | 12/2021 | Zhang et al. | |
| 2023/0169540 | A1* | 6/2023 | Kaddevarmuth | G06F 21/6263<br>705/14.54 |
| 2024/0257186 | A1* | 8/2024 | Na | G06Q 30/0277 |
| 2024/0420216 | A1* | 12/2024 | Stankiewicz | G06Q 30/0643 |
| 2025/0086689 | A1* | 3/2025 | Kataoka | G06Q 30/0631 |

FOREIGN PATENT DOCUMENTS

| | | | |
|---|---|---|---|
| JP | 2011014092 | A | 1/2011 |
| JP | 2015049820 | A | 3/2015 |
| JP | 2020098521 | A | 6/2020 |
| JP | 2022188759 | A | 12/2022 |
| JP | 2024503228 | A | 1/2024 |
| KR | 10-2019-0097612 | A | 8/2019 |
| KR | 10-2190897 | B1 | 12/2020 |
| KR | 102211400 | B1 | 2/2021 |
| KR | 10-2021-0066514 | A | 6/2021 |
| KR | 10-2609682 | B1 | 12/2023 |
| WO | 2015132886 | A1 | 9/2015 |

OTHER PUBLICATIONS

Jin, M. J. (Nov. 3, 2020). Lotte on offers computer-designed clothing. Korean JoongAng Daily. https://koreajoongangdaily.joins.com/2020/11/03/business/industry/lotte-lotte-shopping-lotte-on/20201103175006724.html (Year: 2020).*

Shirkhani, S., Mokayed, H., Saini, R et al. Study of AI-Driven Fashion Recommender Systems. SN Comput. Sci. 4, 514 (2023). https://doi.org/10.1007/s42979-023-01932-9 (Year: 2023).*

Tsao, Yu-Chung, et al. "Intelligent design suggestion and sales forecasting for new products in the apparel industry." Fibres & Textiles in Eastern Europe 31.6 (2023): 30-38. (Year: 2023).*

European search report, issued on Mar. 20, 2025.

Yingchaojie Feng et al., "PromptMagician: Interactive Prompt Engineering for Text-to-Image Creation", Jul. 18, 2023.

Notice of Reasons for Refusal of JP2025009727 issued Aug. 27, 2025.

Request for the Submission of an Opinion of KIPO (Office Action), issued on Jul. 28, 2026.

* cited by examiner

APPARATUS AND METHOD FOR SUPPORTING PRODUCT PLANNING

CROSS-REFERENCE TO RELATED APPLICATIONS

This application claims the priority of Korean Patent Application No. 10-2024-0012648 filed on Jan. 26, 2024, in the Korean Intellectual Property Office, the disclosure of which is incorporated herein by reference.

BACKGROUND

Field

The disclosure relates to a technology supporting product planning, and particularly, to an apparatus and method for supporting product planning that may predict product design planning, and a sales quantity based on data.

Description of the Related Art

Recently, image editing technology using artificial intelligence models has been actively studied, and product design development methods are being developed using the image editing technology. In particular, various models are being developed that receive a specific text prompt and edit an input image.

In addition, various methods of predicting a sales quantity using prediction models have been attempted. However, since most prediction models predict a future sales quantity based on past sales quantities, when there is an error in past data or an unexpected variable occurs that is different from the past sales time, there is a problem that the accuracy of the prediction value is greatly reduced.

Korean Patent No. 10-2609682 discloses a technology for a method for generating a product plan based on trend prediction and a device therefor.

SUMMARY

An object of the present disclosure is to provide an apparatus and method for supporting product planning that may predict product design planning and a sales quantity based on data.

According to one aspect, an apparatus for supporting product planning, includes: an interface configured to input or output data; and a product planner connected to the interface, in which the product planner classifies one or more search images searched based on at least one of collected one or more keywords into one or more clusters, receives a reference image selection input from a user through the interface for selecting at least one of the one or more search images classified into the one or more clusters, receives image editing prompt data from the user through the interface, and outputs a product design image based on one or more images selected as the reference image selection input and the image editing prompt data.

The product planner may classify the collected one or more keywords into a major category keyword and a sub-category keyword according to a predetermined rule, and receive a user's keyword selection input for at least one of the major category keyword and the sub-category keyword through the interface and output a daily search amount based on the user's keyword selection input.

The product planner may receive input for at least one of a search platform, a search keyword, and a search period through the interface, search for an image from the search platform based on the search keyword and the search period to generate one or more search images, and classify the one or more search images to generate one or more clusters.

The product planner may receive input from the user about the number of clusters, determine a predetermined classification criterion according to the number of clusters, and generate clusters of the number of clusters based on the predetermined classification criterion determined according to the number of clusters.

The product planner may estimate an expected sales quantity based on prediction input data including at least one of the product design image, product information, a distribution platform, a celebrity score, a social media score, a sales start date, and a sales price.

The expected sales quantity may be sales quantity data according to date.

The product planner may search for one or more similar products based on the prediction input data.

The product planner may extract comparative input data corresponding to the prediction input data for the one or more similar products, and estimate the expected sales quantity based on the comparative input data for each of the one or more similar products.

The product planner may search for actual sales data for one or more similar products and output the actual sales data along with the estimated expected sales quantity for each of the one or more similar products.

The product planner may output comparative input data corresponding to the prediction input data for one or more similar products.

According to one aspect, a method for supporting product planning performed by a computing device including one or more processors and a memory storing one or more programs executed by the one or more processors, includes: classifying one or more search images searched for based on at least one of collected one or more keywords into one or more clusters; receiving a reference image selection input from a user for selecting at least one of the one or more search images classified into the one or more clusters; receiving image editing prompt data from the user; and outputting a product design image based on one or more images selected by the reference image selection input and the image editing prompt data.

By providing the apparatus for supporting product design planning based on data, the time and cost of product design can be drastically reduced.

In addition, a sales quantity can be predicted more accurately through sales forecasting and search of similar products, and sales quantity fluctuations due to external variables can be intuitively identified.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF EXEMPLARY EMBODIMENTS

Hereinafter, one embodiment of the present disclosure will be described in detail with reference to the attached drawings. In describing the present disclosure, when it is determined that a detailed description of a related known function or configuration may unnecessarily obscure the gist of the present disclosure, the detailed description thereof will be omitted. In addition, the terms described below are terms defined in consideration of the functions in the present disclosure, and these may vary depending on the intention or custom of the user or operator. Therefore, the definitions should be made based on the contents throughout this specification.

Hereinafter, embodiments of an apparatus for supporting product planning and method are described in detail with reference to drawings.

Figure 1:
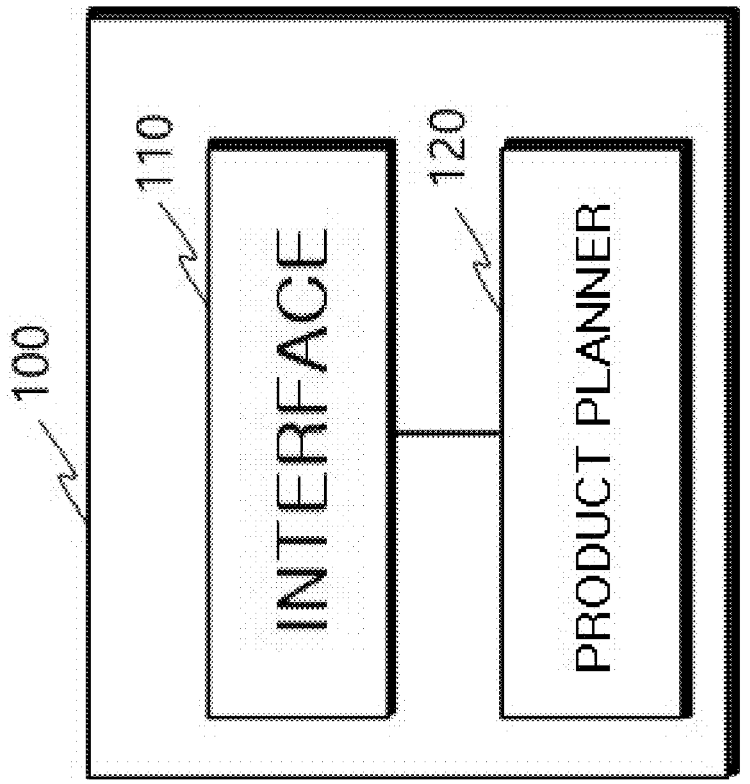
FIG. 1 is a configuration diagram of an apparatus for supporting product planning according to one embodiment.

FIG. 1 is a configuration diagram of an apparatus for supporting product planning according to one embodiment.

Referring to FIG. 1, an apparatus for supporting product planning 100 may include an interface 110 for inputting or outputting data and a product planner 120 connected to the interface 110.

According to one embodiment of the present disclosure, the apparatus for supporting product planning 100 may collect at least one data among design images of clothing, images of clothing, keywords for clothing types, sales quantity, and user reviews from various web/app pages such as Internet shopping malls selling clothing and the company malls of design companies. To this end, for example, the apparatus for supporting product planning 100 may store and execute a crawling agent.

In one embodiment, the apparatus for supporting product planning 100 may convert a clothing design into text or generate a clothing design based on a text.

In another embodiment, the apparatus for supporting product planning 100 may also generate a new clothing design based on input of clothing design and text.

To implement the embodiment, the apparatus for supporting product planning 100 may form a network with at least one generative artificial neural network. Specifically, the apparatus for supporting product planning 100 may build a pre-trained clothing design-text-based multimodal design generation model and use the multimodal design generation model to generate the clothing design.

In this way, the apparatus for supporting product planning 100 may generate a new clothing design image using an embedding vector for text and/or image input data. In particular, according to an embodiment of the present disclosure, the apparatus for supporting product planning 100 may select a plurality of images generated by the initial input as reference image data, and generate a final design image by inputting the reference image data, or the reference image data and an image editing prompt.

For example, the interface 110 may include interface modules such as a monitor, keyboard, mouse, and touch screen for exchanging data with a user. As another example, the interface 110 may include a communication module capable of performing data input/output with an external server, user terminal, or the like.

According to one embodiment, the product planner 120 may classify one or more search images searched based on at least one of the one or more collected keywords into one or more clusters.

According to one embodiment, the product planner 120 may classify one or more collected keywords into a major category keyword and a sub-category keyword according to a predetermined rule, and receive a user's keyword selection input for at least one of the major category keyword and the sub-category keyword through the interface 110 and output a daily search amount based on the user's keyword selection input.

For example, the product planner 120 may collect keywords from an external server according to a predetermined criterion. For example, the product planner 120 may calculate the search amount for each period of the collected keywords or determine a keyword ranking according to the search amount.

Figure 2:
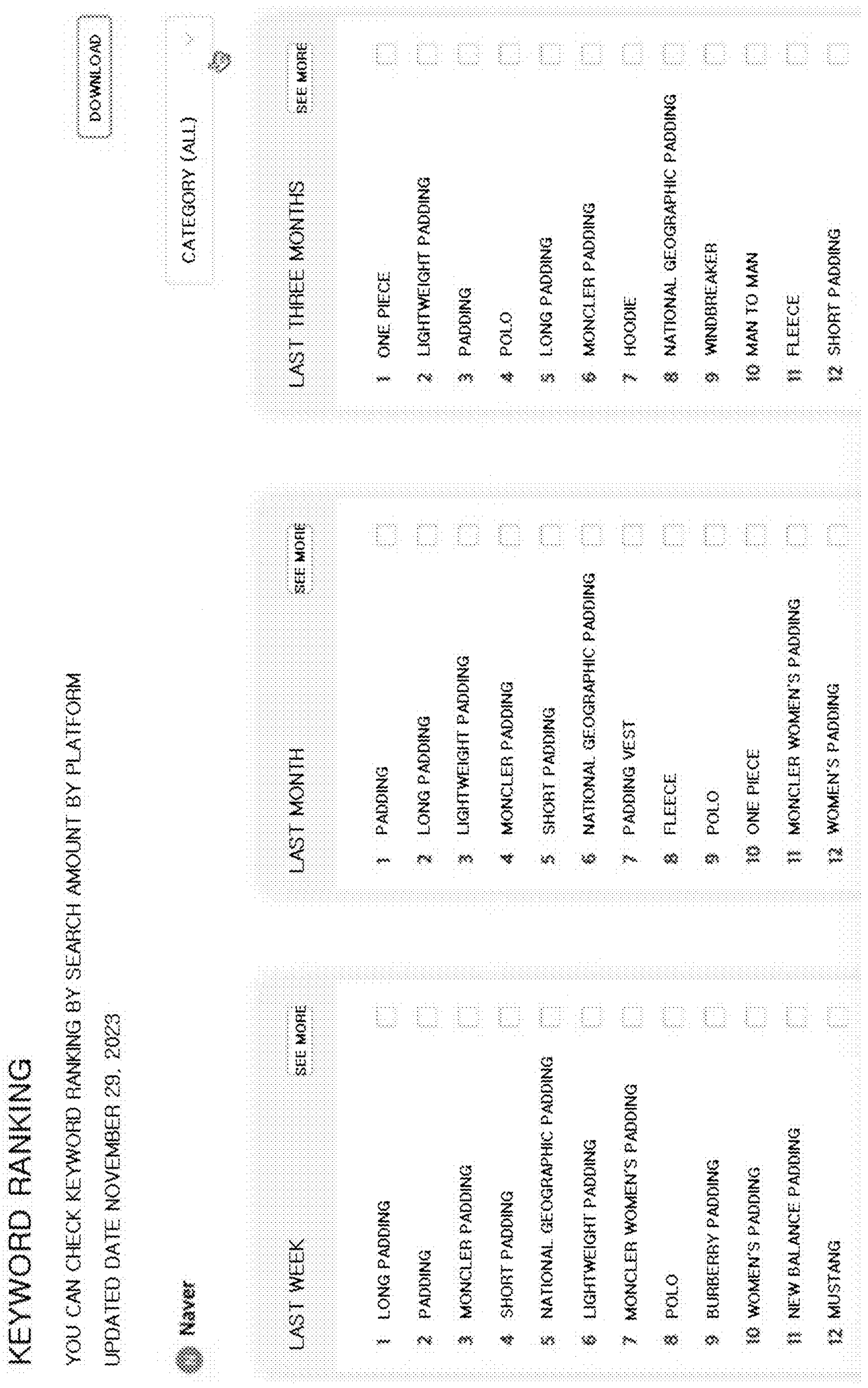
FIGS. 2, 3, 4A, 4B, 5 and 6 are exemplary diagrams for explaining a method for supporting product planning according to one embodiment.
Figure 3:
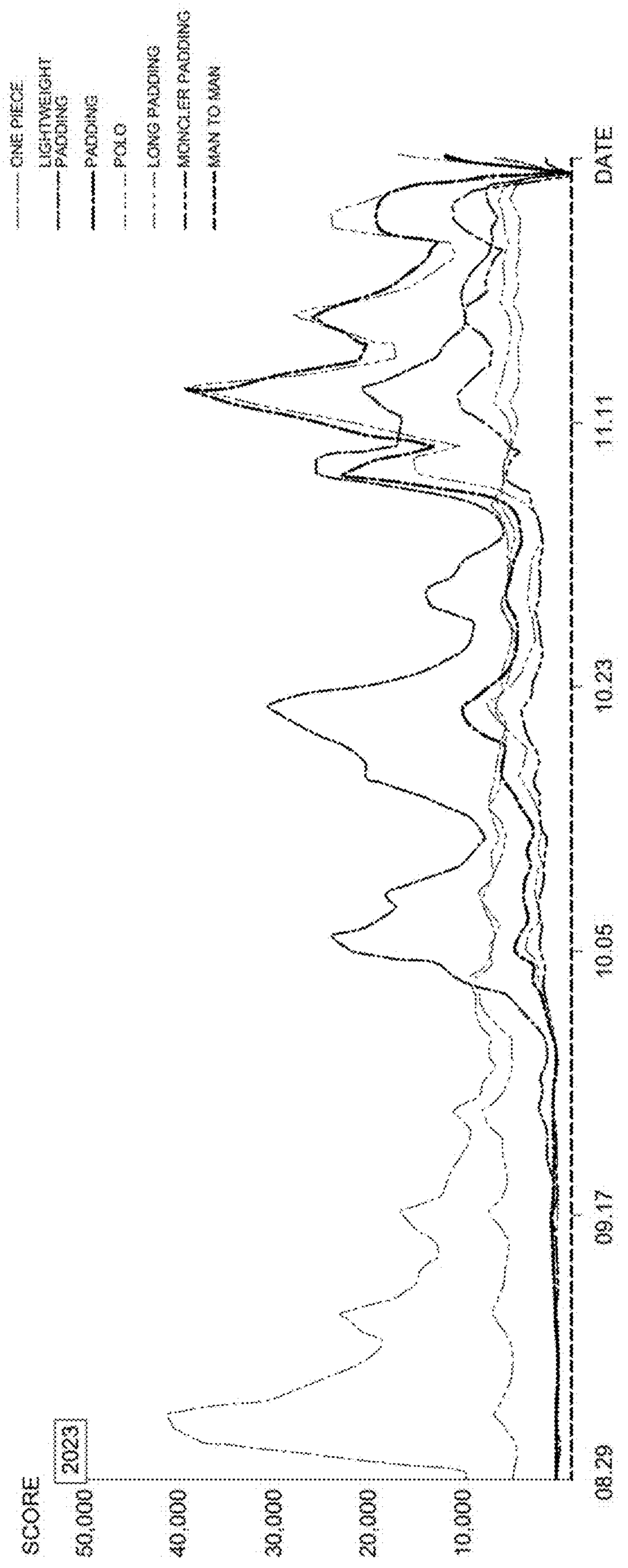

Referring to FIG. 2, the product planner 120 may classify keywords by a given period, such as the last week, the last month, and the last three months. In this case, the product planner 120 may determine the ranking according to the search amount by period. Referring to FIG. 3, the product planner 120 may output the change in search amount by date for each keyword.

For example, the product planner 120 may classify the keyword by grouping similar keywords. For example, the product planner 120 may classify a blue jean and a jean as a jean. Afterwards, the product planner 120 may calculate the search amount of the classified keywords by using the search amount of the grouped similar keywords.

According to one embodiment, the product planner 120 receives input for at least one of a search platform, a search keyword, and a search period through the interface 110, searches for an image from the search platform based on the search keyword and the search period to generate one or more search images, and classifies the one or more search images to generate one or more clusters.

According to an example, the product planner 120 may receive an input for selecting at least one keyword from among the keywords searched for above from the user, and may search for an image based on the input keyword. In this case, the product planner 120 may receive an input for at least one of the search platform, the search keyword, and the search period, and may search for the image from the search platform based on the input search keyword and the search period to generate one or more search images. For example, the product planner 120 may receive an input of a search keyword such as "fur, padding", and may receive data on the search platform and the search period such as "platform A" and "last 1 year". In this case, the product planner 120 may search for an image based on the input condition, and may download the searched image to generate a search image.

For example, the product planner 120 may search for images based on at least one of metadata of images stored in the external server and descriptive data for the images. As another example, the product planner 120 may include a neural network model trained to perform image search according to keywords, and may classify images searched through the neural network model to classify images according to search keywords.

In one example, the product planner 120 may classify one or more search images to generate one or more clusters. For example, the product planner 120 may classify the search images according to a preset classification criterion. For example, the preset classification criterion may include a clothing type, color, material, user gender, length, presence or absence of printing, or the like, and the product planner 120 may classify the search images through some or a combination of the preset classification criteria.

In one example, the product planner 120 may include a neural network model that performs image clustering. The neural network model may utilize conventional image clustering models.

According to one embodiment, the product planner 120 may receive input from the user regarding the number of clusters and determine the predetermined classification criterion based on the number of clusters. For example, the product planner 120 may classify search images by using some or combining the preset classification criteria such as the clothing type, color, material, user gender, length, and presence or absence of printing based on the number of clusters.

According to one embodiment, the product planner 120 may generate clusters of the number of clusters based on a predetermined classification criterion determined according to the number of clusters. For example, as in FIG. 4A, when the user requests the number of clusters of 10, the product planner 120 may classify the search image into 10 clusters and output the clusters. In FIG. 4A, one point is matched to one search image, and when the user selects one point, the matched search image may be output.

Figure 4B:
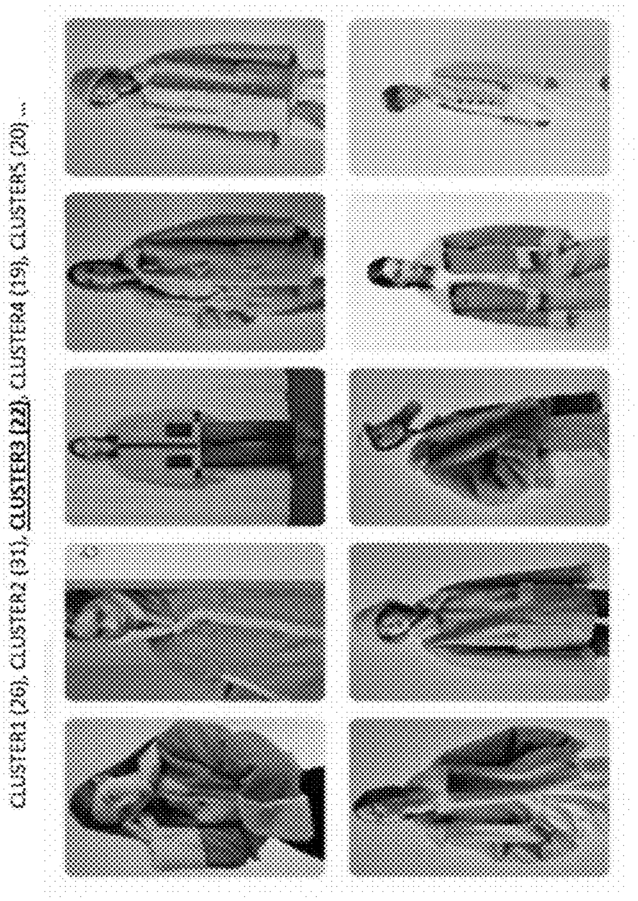
Figure 4A:
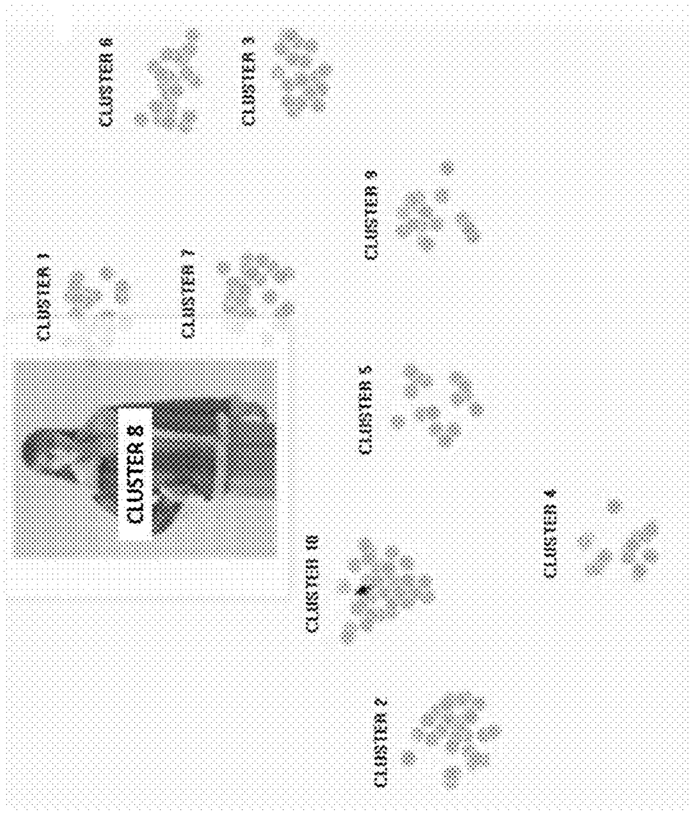

Referring to FIG. 4B, the product planner 120 may output the images classified into clusters by cluster. For example, when a user selects a cluster 3, the product planner 120 may output search images included in the cluster 3.

Figure 5:
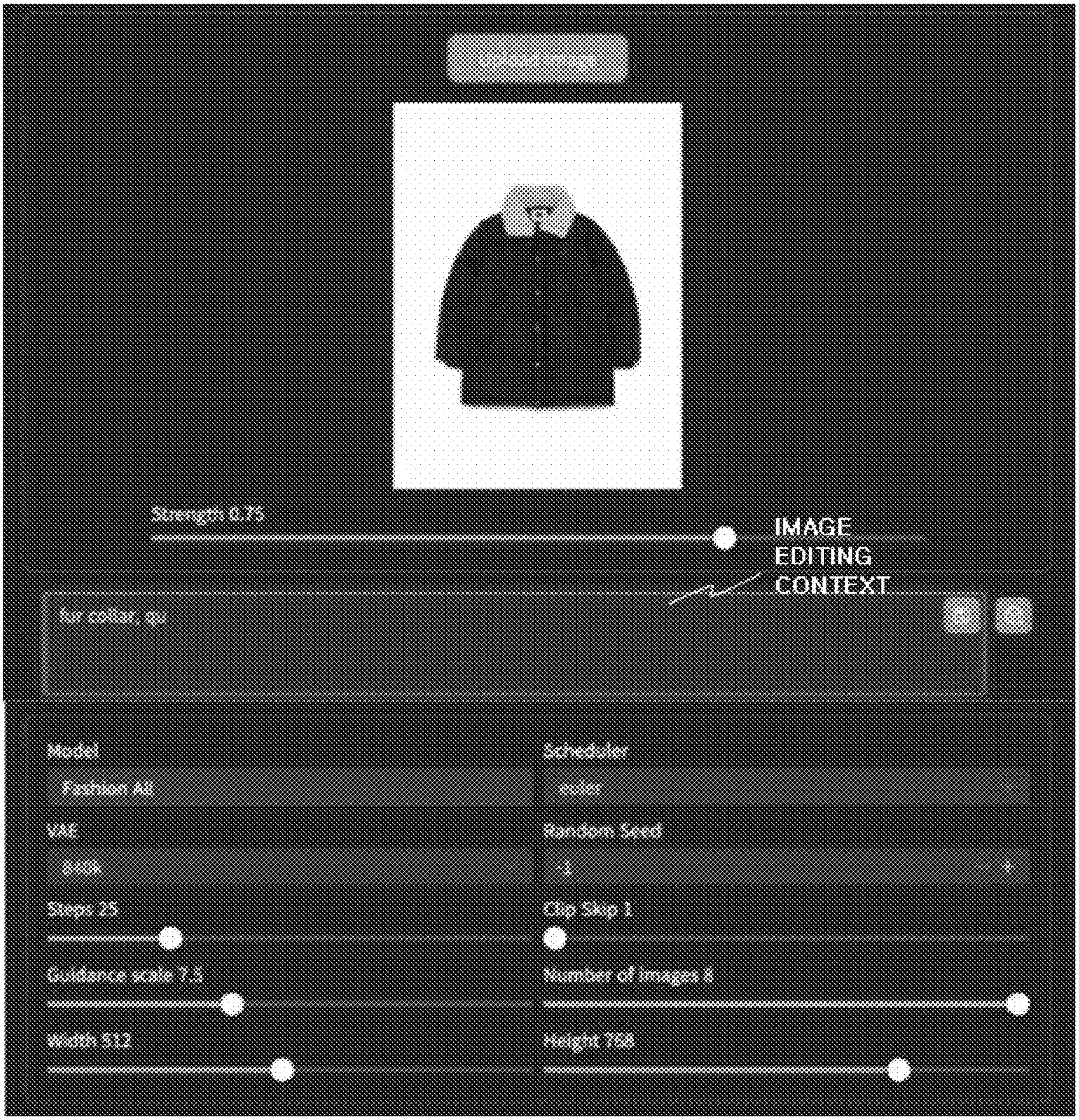

According to one embodiment, the product planner 120 may receive a reference image selection input from the user through the interface 110 to select at least one of one or more search images classified into one or more clusters. For example, the user may select any one of the search images output as the cluster and determine the selected image as a reference image. Referring to FIG. 5, the user may select one search image as the reference image and input the selected reference image.

According to one embodiment, the product planner 120 may receive image editing prompt data from the user through the interface 110. For example, as in FIG. 5, the user may input an image editing prompt for editing the reference image input through the interface 110. The image editing prompt may include a predetermined keyword and may also include a predetermined sentence. In addition, the product planner 120 may receive input of a technical parameter for image editing.

Figure 6:
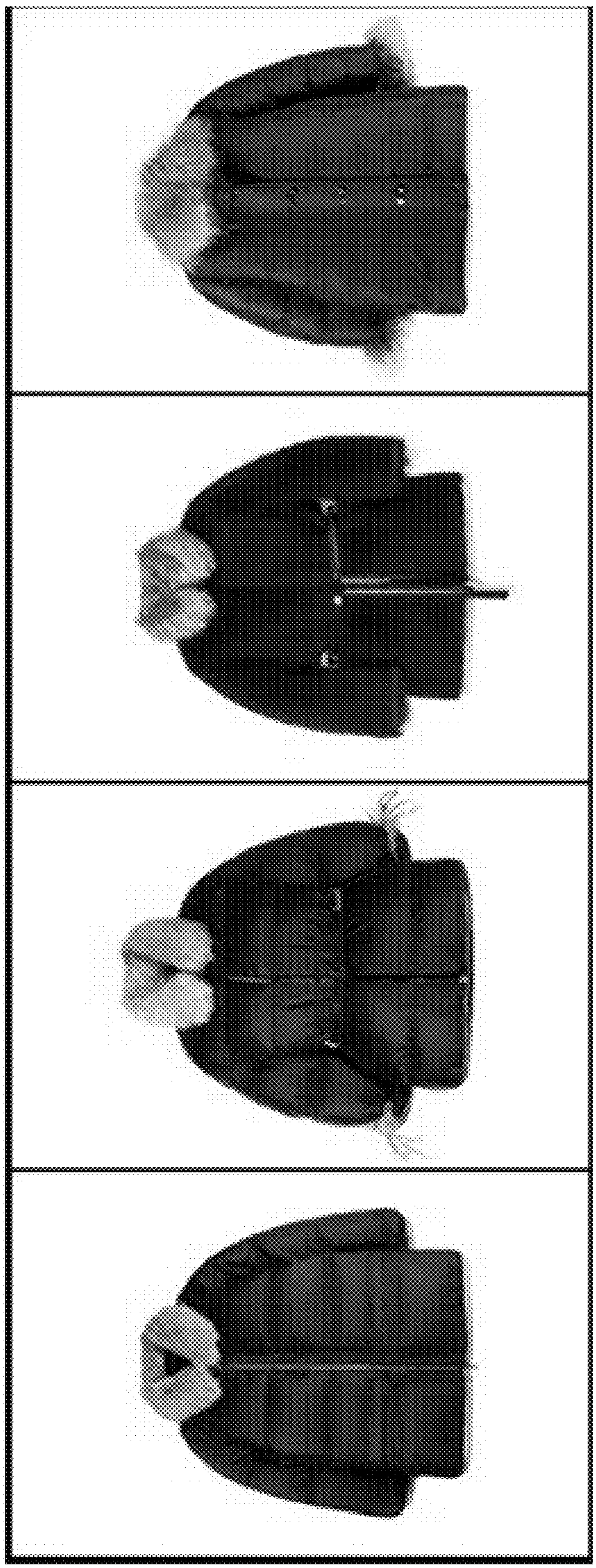

According to one embodiment, the product planner 120 may output a product design image based on one or more images selected as the reference image selection input and the image editing prompt data. Referring to FIG. 6, the product planner 120 may edit the reference image based on the input image editing prompt and output one or more edited images.

According to one embodiment, the product planner 120 may estimate an expected sales quantity based on prediction input data including at least one of a product design image, product information, a distribution platform, a celebrity score, a social media score, a sales start date, and a sales price. For example, the product information may include at least one of a product color, a material, and a length. The celebrity score may be determined based on at least one of a search amount, a number of followers, and a number of celebrities of the celebrity. The social media score may be determined based on at least one of a number of users who uploaded information about the product, a number of followers of the uploading user, a search amount, and a posting volume.

For example, the product planner 120 may receive input for at least one of the product design image, the product information, the distribution platform, the celebrity score, the social media score, the sales start date, and the sales price, and may predict the sales quantity through this. That is, the product planner 120 may predict the sales quantity using information about the product itself, a sales location, a sales period, and a sales price, without data on the past sales quantity. In this case, the product planner 120 may predict the sales quantity according to a predetermined time, such as annually, semi-annually, quarterly, monthly, or weekly. In addition, the product planner 120 may calculate the expected sales quantity according to a date.

According to one embodiment, the product planner 120 of the apparatus for supporting product planning 100 may embedding-vectorize various data such as the celebrity score, distribution platform, and sales price as described above to calculate the expected sales quantity, and predict the expected sales quantity using the embedding vectorized value as an input value. To this end, the product planner 120 may include a demand prediction model that has been trained in advance, and when the various data is input into the demand prediction model as the embedding vectorized values, the expected sales quantity may be output. Since the expected sales quantity as a result is output for a predetermined vector input, it may be viewed as a search result based on vector values, and may be called a vector search function.

For example, the product planner 120 of the apparatus for supporting product planning 100 may convert the result of vector input back into text or quantity, and in the above example, the result vector value may be converted into the expected sales quantity and output.

Figure 7:
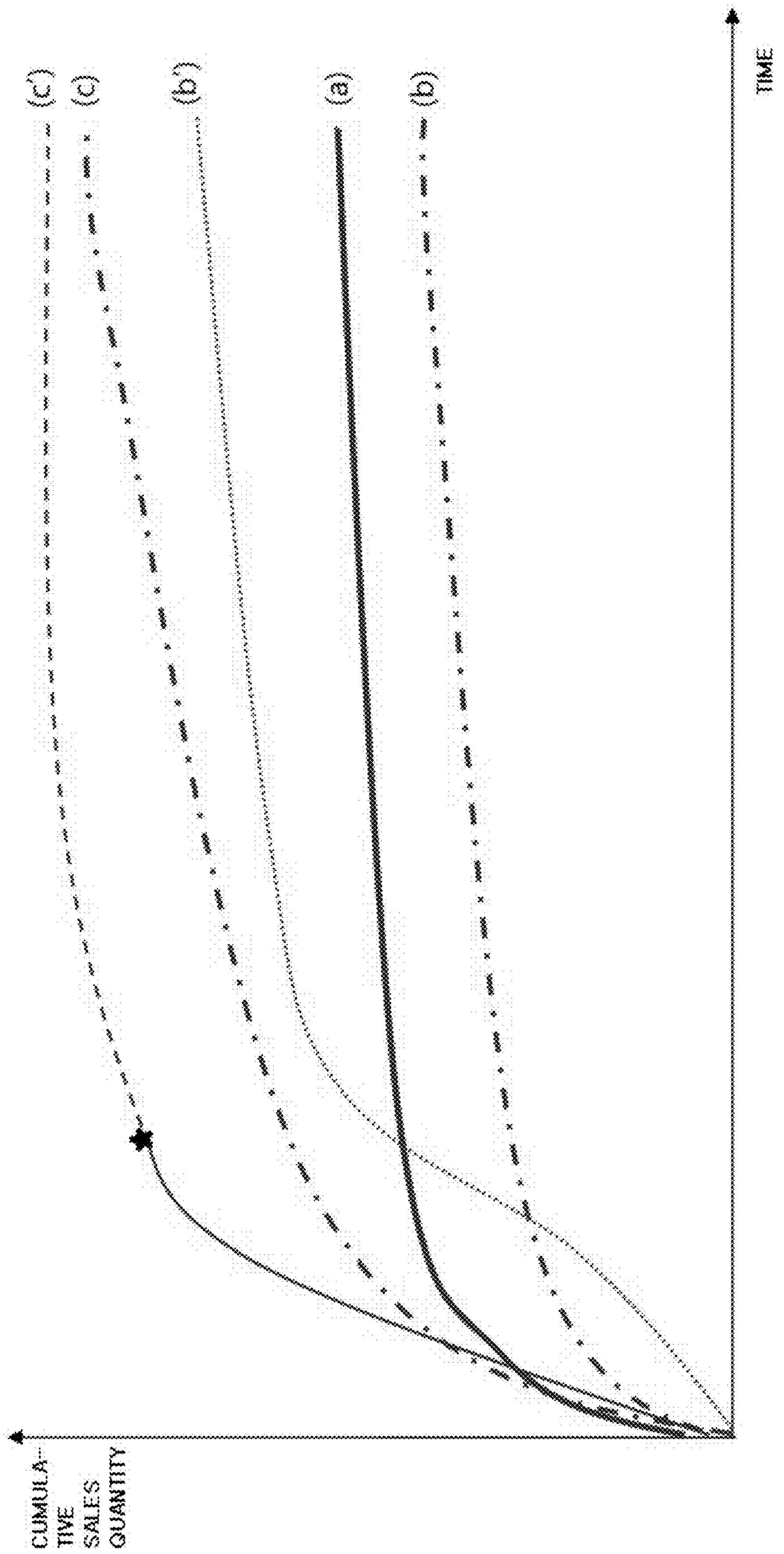
FIGS. 7 and 8 are exemplary diagrams for explaining a method for predicting a product sales quantity according to an embodiment.

Referring to FIG. 7, the product planner 120 may predict the expected sales quantity by date based on input data for a given product and output the expected sales quantity by date. For example, a cumulative sales quantity a by time for the input product may be displayed as a graph.

According to one embodiment, the product planner 120 may search for one or more similar products based on the prediction input data. For example, the product planner 120 may search for one or more products having similar conditions to the product to be predicted based on at least one of the product design image, product information, distribution platform, celebrity score, social media score, sales start date, and sales price. For example, the product planner 120 may calculate the similarity based on the product design image, product information, distribution platform, and sales price, and search for a predetermined number of products with high similarity as the similar products.

According to one embodiment, the product planner 120 may extract comparative input data corresponding to the prediction input data for one or more similar products, and estimate the expected sales quantity based on the comparative input data for each of the one or more similar products.

For example, the product planner 120 may search for a predetermined number of similar products with high similarity, and search for information on at least one of the product design image, product information, distribution platform, celebrity score, social media score, sales start date, and sales price for the products. Through this, the product planner 120 may estimate the expected sales quantity of the similar products based on the information on the searched similar products. For example, as illustrated in FIG. 7, the product planner 120 may search for two similar products b and c, and predict the expected sales quantity for each of the two similar products b and c.

According to one embodiment, the product planner 120 may search for actual sales data for one or more similar products and output the actual sales data along with the estimated expected sales quantity for each of the one or more similar products. For example, in the case of two similar products b and c, since there is already sold data, it is possible to search for the actual sales data information of the corresponding products and output the searched actual sales quantity. For example, as in FIG. 7, graphs b' and c' for actual sales quantity may be output.

For example, the product planner 120 may predict an additional sales quantity based on actual sales quantity data. For example, as in FIG. 7, a graph c' illustrates that actual sales may be stopped at a specific time (asterisk). This may be a problem that occurs because the product may not be sold despite demand due to reasons such as the product being sold out. In this case, the product planner 120 may predict the quantity that may be sold when the product is sold for an additional period based on the actual sales quantity data, and display this on the graph c'.

Referring to FIG. 7, there may be a difference between the predicted product sales quantities b and c and the actual sales quantities b' and c'. This may be due to a difference between the input data and the data generated during actual sales, or the result of non-input data acting as a variable. For example, in the case of the product b, marketing is performed according to the planned marketing schedule, but an unexpected event such as certain celebrities posting the product on their SNS, or the like may occur. In this case, a phenomenon different from the input data may occur, resulting in a different result from the expected sales quantity.

For example, the product planner 120 may output comparative input data corresponding to the prediction input data for one or more similar products. For example, the product planner 120 may output information on at least one of the product design image, product information, distribution platform, celebrity score, social media score, sales start date, and sales price for the similar product.

For example, the product planner 120 may search for and output information on data that may change over time, unlike the initially input data. For example, the product image, sales price, or the like may be fixed data, but the celebrity score, social media score, or the like may be variables that occur from the external consumer side and may change over time.

Figure 8:
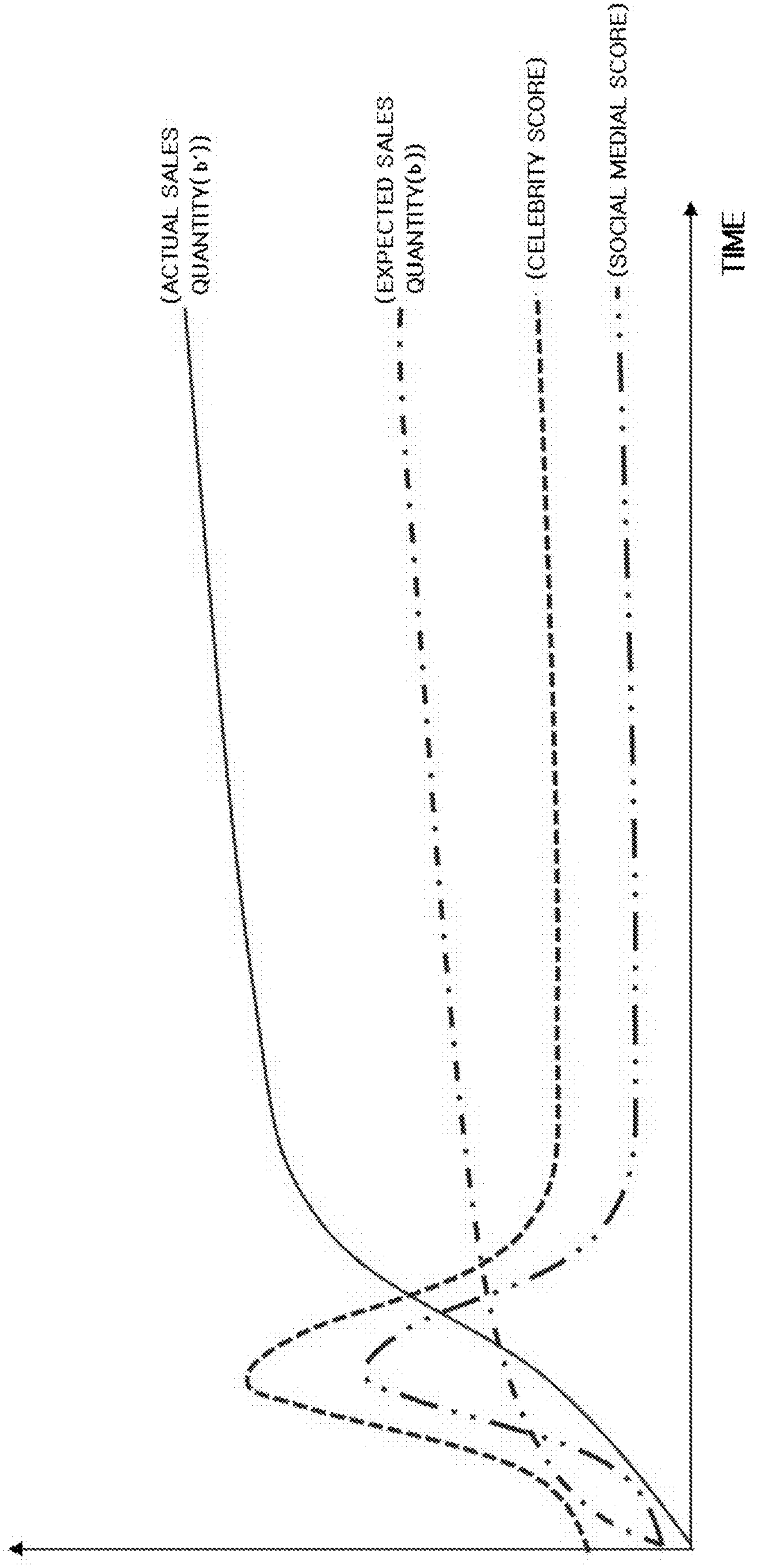

For example, the product planner 120 may search for data on the similar products by period, calculate and output the celebrity score, social media score, or the like. For example, as illustrated in FIG. 8, the product planner 120 may output celebrity scores and social media scores by period along with the expected sales quantity b and the actual sales quantity b' for the product b. As illustrated in FIG. 8, it may be seen that the celebrity score and social media score are high at a specific time, and the user may make predictions about variables by confirming that the sales quantity increases sharply at that time.

Figure 9:
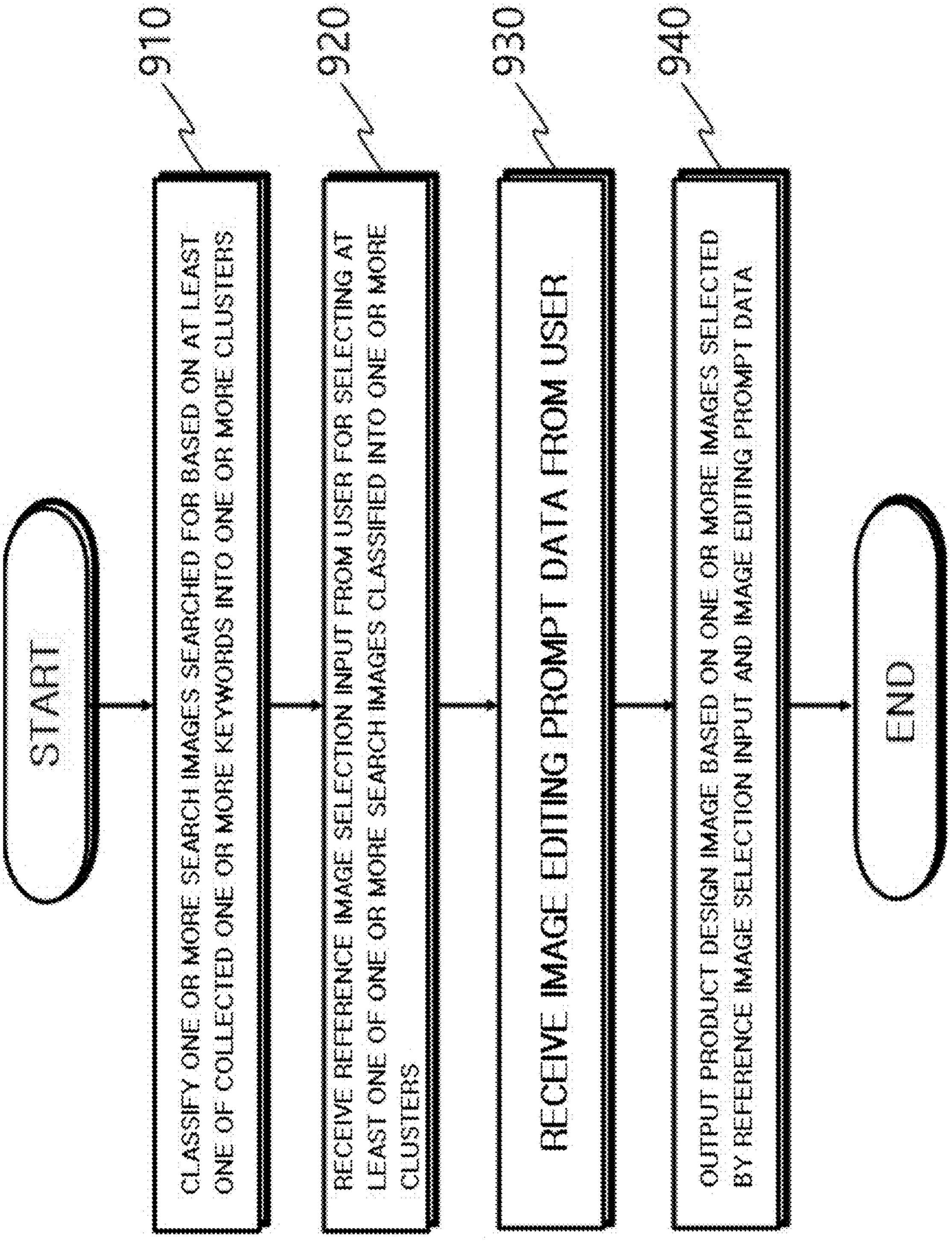
FIG. 9 is a flowchart illustrating a method for supporting product planning according to one embodiment.

FIG. 9 is a flowchart illustrating a method for supporting product planning according to one embodiment.

As an example, the apparatus for supporting product planning may be a computing device including one or more processors and a memory storing one or more programs executed by the one or more processors.

According to one embodiment, the apparatus for supporting product planning may classify one or more search images searched for based on at least one of the collected one or more keywords into one or more clusters, 910, and may receive a reference image selection input from a user for selecting at least one of the one or more search images classified into one or more clusters, 920. In addition, the apparatus for supporting product planning may receive image editing prompt data from the user, 930, and may output a product design image based on one or more images selected by the reference image selection input and the image editing prompt data, 940.

Among the embodiments of FIG. 9, embodiments that overlap with the contents described with reference to FIGS. 1 to 8 are omitted.

One aspect of the present disclosure may be implemented as computer-readable codes on a computer-readable recording medium. Codes and code segments implementing the above program may be easily inferred by a computer programmer in the art. The computer-readable recording medium may include all kinds of recording devices that store data that may be read by a computer system. Examples of the computer-readable recording medium may include ROM, RAM, CD-ROM, magnetic tape, floppy disk, optical disk, or the like. In addition, the computer-readable recording medium may be distributed to computer systems connected to a network, and may be written and executed as computer-readable codes in a distributed manner.

The present disclosure has been described so far with reference to preferred embodiments thereof. Those skilled in the art will understand that the present disclosure may be implemented in modified forms without departing from the essential characteristics of the present disclosure. Accordingly, the scope of the present disclosure should not be limited to the above-described embodiments, but should be interpreted to include various embodiments within a scope equivalent to the contents described in the claims.

What is claimed is:

1. An apparatus for supporting product planning, the apparatus comprising:

an interface configured to input or output data; and a product planner connected to the interface, wherein the product planner comprises:

one or more processors;

a memory storing one or more programs, wherein, being executed by the one or more processors, the one or more programs cause the product planner to implement:

a text-based-design generation model;

a keyword-based-image-search neural network; and a demand prediction neural model, the product planner, with the one or more programs being executed by the one or more processors, performs:

collecting a plurality of pairs of a reference text and a reference design;

pre-training the text-based-design generation model with the plurality of pairs of the reference text and the reference design;

collecting a plurality of pairs of a reference keyword and a reference image;

pre-training the keyword-based-image-search neural network with the plurality of pairs of the reference text and the reference design;

collecting a plurality of pairs of a reference sales quantity and a reference data including at least one of the product design image, product information, a distribution platform, a celebrity score, a social media score, a sales start date and a sales price; and pre-training the demand prediction model with the plurality of pairs of the reference sales quantity and the reference data including at least one of the product design image, the product information, the distribution platform, the celebrity score, the social media score, the sales start date and the sales price, the product planner, with the one or more programs being executed by the one or more processors, further performs:

collecting one or more keywords;

classifying, with the pre-trained keyword-based-image-search neural network, the one or more search images searched based on at least one of the collected one or more keywords into one or more clusters;

receiving a reference image selection input from a user through the interface for selecting at least one of the one or more search images classified into the one or more clusters;

receiving image editing prompt data from the user through the interface;

outputting, with the pre-trained text-based-design generation model, a product design image based on one or more images selected as the reference image selection input and the image editing prompt data;

receiving a prediction input data including at least one of the product design image, the product information, the distribution platform, the celebrity score, the social media score, the sales start date and the sales price; and estimating, with the pre-trained demand prediction model, an expected sales quantity based on the received prediction input data including the at least one of the product design image, the product information, the distribution platform, the celebrity score, the social media score, the sales start date and the sales price.

2. The apparatus according to claim 1, wherein the product planner further classifies, with the pre-trained keyword-based-image-search neural network, the collected one or more keywords into a major category keyword and a sub-category keyword according to a predetermined rule, and receives a user's keyword selection input for at least one of the major category keyword and the sub-category keyword through the interface, and outputs, with the pre-trained keyword-based-image-search neural network, a daily search amount based on the user's keyword selection input.

3. The apparatus according to claim 1, wherein the classifying the one or more search images searched based on the at least one of collected one or more keywords into the one or more clusters comprises:

receiving input for at least one of a search platform, a search keyword, and a search period through the interface;

searching, with the pre-trained keyword-based-image-search neural network, for an image from the search platform based on the search keyword and the search period to generate one or more search images; and classifying, with the pre-trained keyword-based-image-search neural network, the one or more search images to generate the one or more clusters.

4. The apparatus according to claim 3, wherein the product planner further receives input from the user about the number of clusters, determines, with the pre-trained keyword-based-image-search neural network, a predetermined classification criterion according to the number of clusters, and generates, with the pre-trained keyword-based-image-search neural network, clusters of the number of clusters based on the predetermined classification criterion determined according to the number of clusters.

5. The apparatus according to claim 1, wherein the expected sales quantity is sales quantity data according to date.

6. The apparatus according to claim 1, wherein the product planner further searches, with the pre-trained keyword-based-image-search neural network and the pre-trained demand prediction model, for one or more similar products based on the prediction input data.

7. The apparatus according to claim 6, wherein the product planner further extracts comparative input data corresponding to the prediction input data for the one or more similar products, and estimates, with the pre-trained demand prediction model, the expected sales quantity based on the comparative input data for each of the one or more similar products.

8. The apparatus according to claim 7, wherein the product planner further searches, with the pre-trained keyword-based-image-search neural network and the pre-trained demand prediction model, for actual sales data for the one or more similar products and outputs the actual sales data along with the estimated expected sales quantity for each of the one or more similar products.

9. The apparatus according to claim 6, wherein the product planner further outputs, with the pre-trained keyword-based-image-search neural network and the pre-trained demand prediction model, comparative input data corresponding to the prediction input data for one or more similar products.

10. A method for supporting product planning performed by a computing device including one or more processors and a memory storing one or more programs executed by the one or more processors, the method comprising:

collecting a plurality of pairs of a reference text and a reference design;

pre-training a text-based-design generation model with the plurality of pairs of the reference text and the reference design;

collecting a plurality of pairs of a reference keyword and a reference image;

pre-training a keyword-based-image-search neural network with the plurality of pairs of the reference text and the reference design;

collecting a plurality of pairs of a reference sales quantity and a reference data including at least one of the product design image, product information, a distribution platform, a celebrity score, a social media score, a sales start date and a sales price; and pre-training a demand prediction model with the plurality of pairs of the reference sales quantity and the reference data including at least one of the product design image, the product information, the distribution platform, the celebrity score, the social media score, the sales start date and the sales price, collecting one or more keywords;

classifying, with the pre-trained keyword-based-image-search neural network, the one or more search images searched for based on at least one of collected one or more keywords into one or more clusters;

receiving a reference image selection input from a user for selecting at least one of the one or more search images classified into the one or more clusters;

receiving image editing prompt data from the user;

outputting, with the pre-trained text-based-design generation model, a product design image based on one or more images selected by the reference image selection input and the image editing prompt data;

receiving a prediction input data including at least one of the product design image, the product information, the distribution platform, the celebrity score, the social media score, the sales start date and the sales price; and estimating, with the pre-trained demand prediction model, an expected sales quantity based on the received prediction input data including the at least one of the product design image, the product information, the distribution platform, the celebrity score, the social media score, the sales start date and the sales price.

* * * * *